United States Patent [19]

Trudel et al.

[11] 4,353,083

[45] Oct. 5, 1982

[54] LOW VOLTAGE NONVOLATILE MEMORY DEVICE

[75] Inventors: Murray L. Trudel, Centerville; George C. Lockwood, Dayton; G. Glenn Evans, Kettering, all of Ohio

[73] Assignee: NCR Corporation, Dayton, Ohio

[21] Appl. No.: 192,977

[22] Filed: Oct. 1, 1980

Related U.S. Application Data

[63] Continuation of Ser. No. 964,014, Nov. 27, 1978, abandoned.

[51] Int. Cl.³ .................... H01L 29/78; H01L 29/90; H01L 29/34; G11C 11/34
[52] U.S. Cl. ........................................ 357/23; 357/13; 357/54; 357/89; 365/184
[58] Field of Search ................ 357/23 VT, 13, 54, 89; 365/184

[56] References Cited

U.S. PATENT DOCUMENTS 3,719,866  3/1973  Naber et al. .................. 357/23 VT
4,017,888  4/1977  Christie et al. ...................... 357/54
4,019,198  4/1977  Endo et al. .................... 357/23 VT
4,068,217  1/1978  Arnett et al. ......................... 357/54
4,101,921  7/1978  Shimada et al. .............. 357/23 VT
4,151,538  4/1979  Polinsky et al. ..................... 357/54
4,307,411  12/1981  Carnes et al. ......................... 357/54

*Primary Examiner*—Gene M. Munson
*Attorney, Agent, or Firm*—J. T. Cavender; T. Rao Coca; Philip A. Dalton

[57] ABSTRACT

A low voltage write, avalanche breakdown, nonvolatile MNOSFET memory device. The device is preferably an n-channel enhancement mode, split-gate or trigate structure having a first, relatively highly doped p+ channel region and a second, underlying p-region. The p+ region is coextensive with the thin, memory oxide structure. The binary state of the device is selected by applying a low voltage (e.g., +12v) to the gate and simultaneously applying a suitable voltage to the source and/or drain to induce avalanche breakdown in the channel, or not, to write the device to a "1" state or maintain the device in its original "0" state.

9 Claims, 5 Drawing Figures

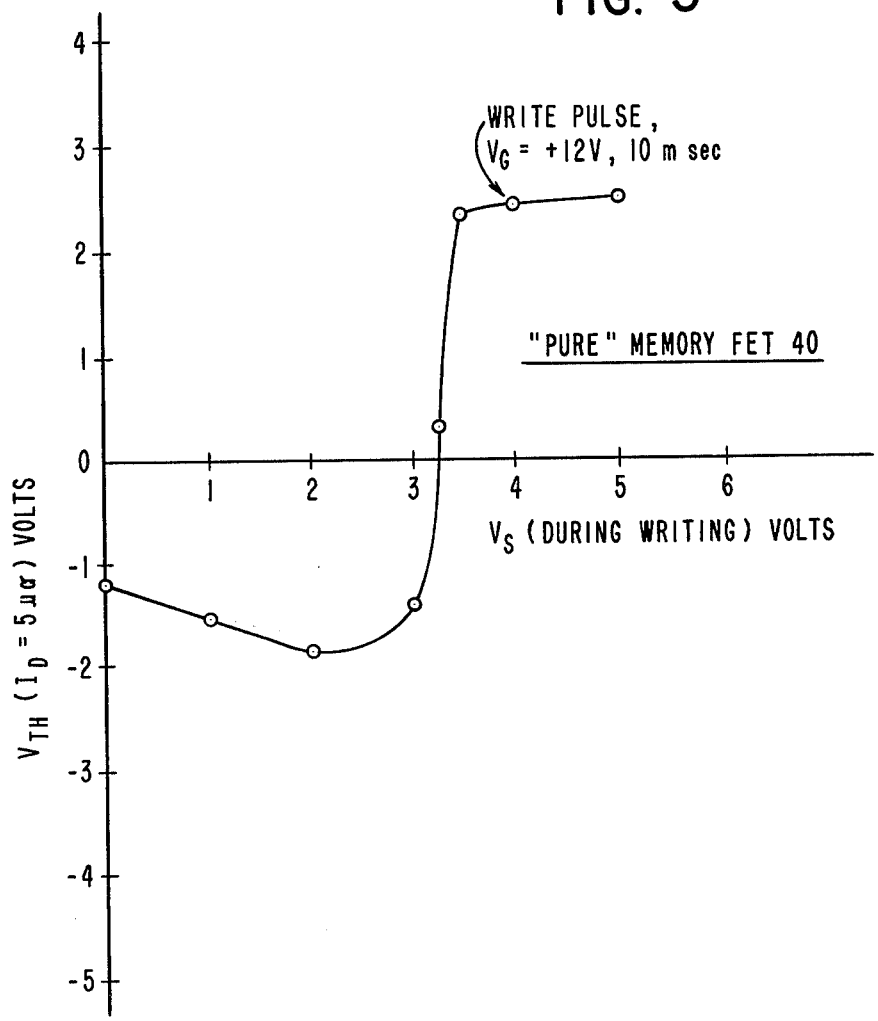

LOW VOLTAGE NONVOLATILE MEMORY DEVICE

This is a continuation of copending application Ser. No. 964,014, filed Nov. 27, 1978 now abandoned.

BACKGROUND OF THE INVENTION

The present invention relates to semiconductor memory devices, and in particular to charge storage semiconductor memory devices of MNOS structure.

Because of its excellent memory operational characteristics, MNOS (metal-nitride-oxide-semiconductor) technology is experiencing increasing application to various types of semiconductor integrated circuit memory arrays, such as EAROM's, WAROM's, and NVRAM's. In order to minimize the complexity, power dissipation and cost of a chip which uses MNOS devices (indeed any type of semiconductor device), it is desirable to keep the operating voltages to a minimum number of preferably small magnitude voltages.

Consider as an example an MNOS NVRAM (Non-Volatile Radom Access Memory). The volatile RAM part of such a device typically requires a 5 volt power supply and a ground connection. In addition, the non-volatile memory portion requires a gate voltage of approximately 30 volts magnitude for writing, and a control voltage (applied to the channel via the source or drain) of about the same magnitude. Reduced complexity, power dissipation and cost could be achieved by decreasing the control voltage and the gate voltage requirements so that the RAM 5 volt power supply can be used to supply the control voltage and the gate voltage.

There are other, operational reasons for using low voltages. This is particularly true of n-channel MNOS integrated devices, which have unique problems at high voltages. For example, these devices exhibit relatively low breakdown voltages and are susceptible to avalanching and other voltage-related phenomena.

N-channel MNOS devices are also susceptible to channel dopant-sensitive spurious writing during channel-shielded operation. MNOS n-channel devices typically are adjusted to enhancement operation by implanting the substrate with p-type ions such as boron. A device, initially in a low threshold voltage, "0" state, will be channel-shielded and thereby prevented from writing to a "1" state when the gate is pulsed with a large positive voltage, +V, and the source is also pulsed with a positive voltage, with the substrate at ground. A channel is formed from the source to the drain, but the positive source voltage is applied to the channel, thereby diminishing the potential difference between the gate and the substrate and preventing writing. Consequently, the threshold remains at the low magnitude voltage. To write the device to a "1" state, the gate is again pulsed to +V with the substrate at 0 volts, but this time the source is at, e.g., 0 volts. Here, the channel potential is 0 volts and a high voltage field is present from the gate to the channel. As a result, negative charge tunnels from the substrate to the silicon dioxide-silicon nitride gate dielectric and is trapped therein, raising the threshold to, e.g., about +10 volts. When the channel-shielded MNOS device is sensitive to the enhancement impurity concentration, excessive impurity concentration can cause breakdown between the channel and the substrate during the channel-shielded operation. The channel-shielded operation may then cause unwanted avalanche writing of the device to the "1" state.

The MNOS microelectronics industry has addressed itself to decreasing high gate voltages with mixed success. For example, U.S. Pat. No. 4,019,198 issued Apr. 19, 1977 to Endo et al. relates to a nonvolatile p-channel MNOS semiconductor memory device having a high concentration impurity layer of the same conductivity type as the substrate surrounding the source and/or the drain. The aim of the patent is to use avalanche 0 writing (erasing) caused by the impurity layer to provide relatively low 0 write (erase) voltages and a large threshold window.

U.S. Pat. No. 4,017,888 issued Apr. 12, 1977 to Christie et al. relates to a nonvolatile depletion structure n-channel MNOS memory device which is written by pn junction avalanche breakdown. The device includes a substrate of a first conductivity type (p−), and a source and drain of the second conductivity type (n) which are connected by a permanent channel (n) to form a depletion mode structure. A highly doped layer of the first conductivity type (p+) underlies the permanent channel. This channel is separated from the gate electrode by a dual dielectric, including a relatively thick 75 Angstrom memory oxide.

The Christie device is written to a "1" state by applying a +18 volt signal through the gate with the source and drain at +10 volts and the substrate at ground. These voltages cause avalanche breakdown of the pn junction between the n-channel and the doped p-layer and thereby inject hot electrons into the dielectric to write the device to a reported threshold of approximately 10 volts. Applying +18 volts to the gate with the source, drain and substrate at ground erases the device.

Despite the improvements exemplified by the above patents, it is apparent there is a need for devices which use low write voltages.

SUMMARY OF THE INVENTION

Accordingly, it is an object of the present invention to provide a low voltage write avalanche breakdown, nonvolatile MNOS memory device which is fabricated in a simple manner.

It is another object to provide an n-channel enhancement mode low voltage write memory device which is not subject to the problem of channel dopant-sensitive, spurious writing.

It is still another object to provide an enhancement mode, low voltage write memory device which uses the channel shielding technique for writing.

These and other objects are provided in a semiconductor memory device which comprises a p type substrate having a spaced apart n type source and drain which define a channel region. The device has a charge storage gate structure, typically a nitride-oxide charge storage insulator, overlying the channel; and a p+p− junction in the substrate. The p+p− structure includes a first, p+ conductivity type region between the source and drain in the channel region defined by the thin-oxide memory structure and a second, p− region which constitutes the substrate resistivity beneath the first region.

The binary state of the device is selected by applying a low voltage (e.g. +12 V) to the gate and simultaneously applying a suitable voltage of the same polarity to the source and/or drain junctions to institute avalanche breakdown in the channel region or not, and thereby to write the device to a "1" state or maintain the device in its original erased "0" state.

The invention is applicable to p channel enhancement structures also. For such structures, the first and second junction-forming layers are n+n— and the gate and source/drain write voltages are negative.

BRIEF DESCRIPTION OF THE DRAWING

FIGS. 3 and 5 show plots of the threshold voltage of the devices of FIG. 1 and FIG. 4, respectively, as a function of the channel shielding voltage, $V_S$, at a gate voltage of +12 volts.

DETAILED DESCRIPTION

Figure 1:
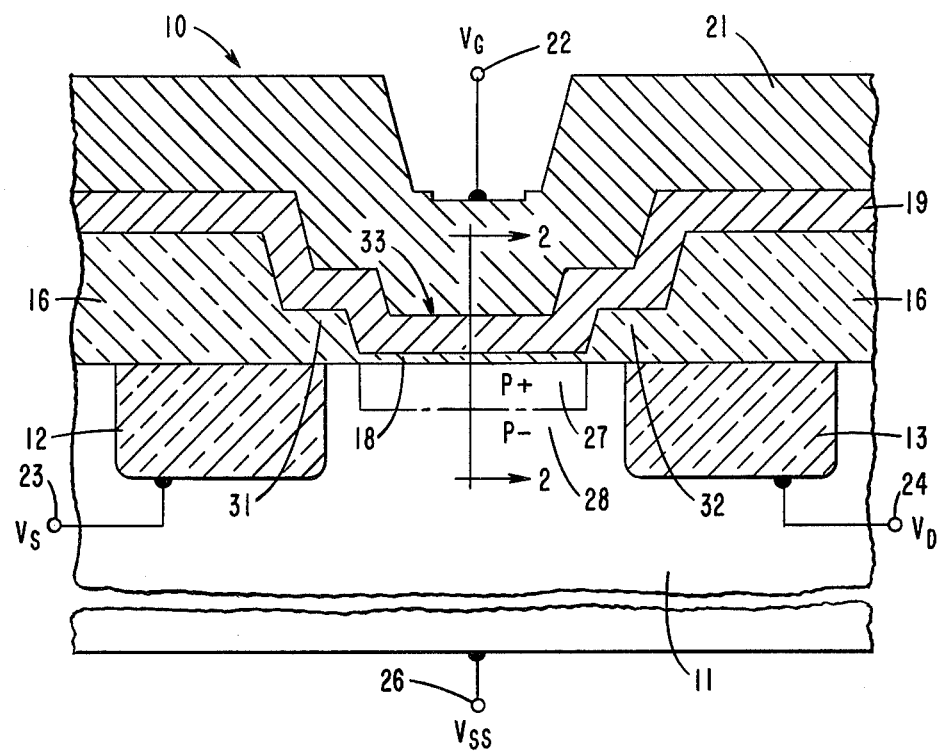
FIGS. 1 and 4 are cross-sectional views of alternative embodiments of a low voltage write, avalanche breakdown nonvolatile MNOS memory device incorporating the principles of the present invention.

FIG. 1 is a cross-sectional view taken parallel to the channel of a low voltage write, avalanche breakdown MNOS field effect transistor 10 embodying the principles of the present invention. The transistor 10 is exemplary of a class of devices which embodies the principles of the present invention. The transistor 10 comprises a substrate 11 of one conductivity type (illustratively p-type) within which are spaced-apart surface-adjacent, channel-defining source and drain regions 12 and 13 of the second, opposite-conductivity type (n-type). A thick insulating layer 16, typically of silicon dioxide, is formed on the substrate 11 to prevent field inversion and electrically isolate the device 10. A gate structure comprising a layered dual insulator and a gate electrode 21 overlies the channel region between the source 12 and the drain 13. The gate electrode is any suitable conductive material such as aluminum, aluminum-silicon, or polysilicon. The insulator structure in the memory region comprises a relatively thin silicon dioxide layer 18 of about 10–60 Angstroms thickness (1–6 nanometers, nm) for permitting charge transfer between the substrate and the gate, and silicon nitride layer 19 of about 350 to 450 Angstroms thickness (35–45 nm).

Preferably, the silicon dioxide layer includes at least one of thick portions 31 and 32 which are formed at the sides of the memory oxide 18 adjacent the source and/or the drain. The portions 31 and 32 are relatively thick (e.g., about 400 Angstroms, 40 nm) to hinder charge transfer between 31 or 32 and the substrate and thereby to prevent memory operation of the underlying channel portion. These non-memory oxide portions 31 and 32 can be placed at either the source or the drain side of the memory oxide 18 or both to control the "0" state threshold voltage and to increase gate modulated junction breakdown between the source and substrate and/or the drain and substrate, respectively. The resulting "split gate" and "trigate" structures are described more fully in U.S. Pat. No. 3,719,866, issued to Naber and Lockwood and assigned to NCR Corporation. This patent is incorporated by reference.

For purposes of illustration, electrical contacts 22, 23, 24 and 26 are shown connected to the gate 21, source 12, drain 13, and substrate 11, respectively, for applying bias voltage which control the conduction path and current across the channel region. Those skilled in the art will understand that this particular electrical contact arrangement is shown merely to facilitate description: for example, contact to the source and drain junctions is usually made at a single point along each of a pair of diffusion stripes which comprise the source and the drain for a plurality of devices.

The transistor 10 is characterized by a p+p— substrate doping concentration profile in the memory channel region 33: a p+ region or layer 27 has a higher p type doping concentration than underlying region 28, which can constitute the p— bulk substrate.

FIG. 1 illustrates a primary object of the present invention: to provide a low voltage write, enhancement type memory device which is of relatively simple construction and can be fabricated in a simple fashion. This can be accomplished by suitably doping the channel region under the non-memory portions of the tri-gate structure (regions 31 and 32) with p type impurities to yield a fixed enhancement, non-memory threshold voltage (VNM) of, for example, approximately +1 V, and by adjusting the p type impurity concentration in the memory channel region 33 such that a "0" state threshold voltage VT0≦approximately +1 V and a "1" state threshold voltage VT1>>+1 V can be obtained through proper voltage biasing of the memory device.

The theory of operation of transistor 10 is as follows. Starting with the memory device in the erased state, a low voltage write pulse (e.g. +12 V, 10 msec) is applied to the gate electrode 21. Writing with 0 volts on the source and drain electrodes 23 and 24 and 0 volts on the substrate electrode 26 causes little change in the threshold voltage from that of the erased state. Consider, however, that at the same time, a small positive voltage pulse (e.g. +5 V, 10 msec) is applied to the source 12 and/or drain 13 of the device via electrode 23 or 24. The p+ layer 27 in the memory channel region is driven into deep depletion by virtue of the pulsed operation. However, the p+ doping concentration limits the maximum width of the depletion region to approximately 500–700 A°. For a p+ dopant concentration of at least about $10^{18}$/cm$^3$, this occurs with about 3 V across the depletion region, at which time the substrate silicon in the depleted p+ region undergoes avalanche breakdown. Hot electron carriers are generated by the avalanche breakdown and injected into the gate insulator 18–19 by the potential difference between the gate electrode and the channel. After being transferred into the gate insulator, the negative charge is trapped and stored at the interface between the memory oxide 18 and the nitride 19 as well as in the nitride bulk. Upon removal of the write voltages it is found that the threshold voltage of the memory device has shifted to a more positive value by virtue of the trapped negative charge. Thus, starting from a fully erased state the device can be maintained in the erased state or written to a relatively high positive threshold voltage state. These two states conveniently represent the logic states 0 and 1, and the MNOS device 10 maintains both states for an indefinite period of time.

As evidenced from the theory of operation described in the preceding paragraph, the present invention uses the channel shielding *technique* described in the Background of the Invention (i.e., voltages of the same polarity are applied to the gate and to the source or drain), but uses the technique to avalanche write the device, not to inhibit writing. Herein, "channel-shielded write" refers to the application of channel shielding techniques to write, rather than to prevent writing.

EXAMPLE 1

Transistor 10 was fabricated using conventional processing techniques. The aim, based upon the above-described theory, was to achieve a low write voltage of $\leq 12$ volts and a maximum source and/or drain control voltage of $\leq 5$ volts.

The substrate 11 was silicon, doped with boron to a p type background concentration of $10^{15}$ atoms/cm$^3$, approximately 7 ohms-cm. The n+ type source 12 and drain 13 were formed by diffusion of phosphorus with a final concentration at the surface of about $10^{20}$/cm$^3$ and a junction depth of about one micron. A gate oxide of about 400 Angstroms thickness (40 nm) was formed over the channel within thick field oxide 16 (which was about 1.0 micron in thickness) prior to formation of the substrate region 27. To obtain enhancement type non-memory gates, the channel was then implanted through the 400 A° oxide using boron at 60 keV and a dose of $5 \times 10^{11}$/cm$^2$. (Note: this implantation step does not complicate the process, since this low dose ($5 \times 10^{11}$/cm$^2$) implant is also used to set the threshold voltage of peripheral non-memory gates). Then, the memory gate was doped by implanting boron atoms at a dose of $3 \times 10^{13}$ atoms per square centimeter and an energy of about 30 keV through the 400 Angstrom (40 nm) gate silicon dioxide into the substrate silicon beneath the memory region 33. The non-memory regions 31 and 32 and the substrate regions beneath 31 and 32 were protected from the memory doping by a previously applied photoresist coating layer which was photolithographically patterned in such a way that the photoresist was removed only in the memory channel region 33. The implantation resulted in a p+ layer 27 about 1500 A° in thickness with an average boron doping concentration of about $2 \times 10^{18}$/cm$^3$.

Subsequent to the boron implant, the silicon dioxide in the memory region was etched away using buffered hydrofluoric acid, the photoresist was stripped and the memory silicon dioxide layer 18 was thermally grown to a thickness of about 20 A° in an oxygen atmosphere and at a temperature of about 600° C. Approximately 400 A° of silicon nitride 19 was then deposited over the entire structure by chemical vapor deposition using silane and ammonia reactants. Source, drain and substrate contact holes were defined using hot phosphoric acid (to etch the nitride) and buffered hydrofluoric acid (to etch the oxide). An aluminum film (1.0 micron) was then deposited over the surface of the wafer in a metal evaporation system. The gate (21), source (23) and drain (24) electrodes were subsequently formed using standard photolithographic techniques. The resultant structure comprises a tri-gate memory device 10.

Figure 2:
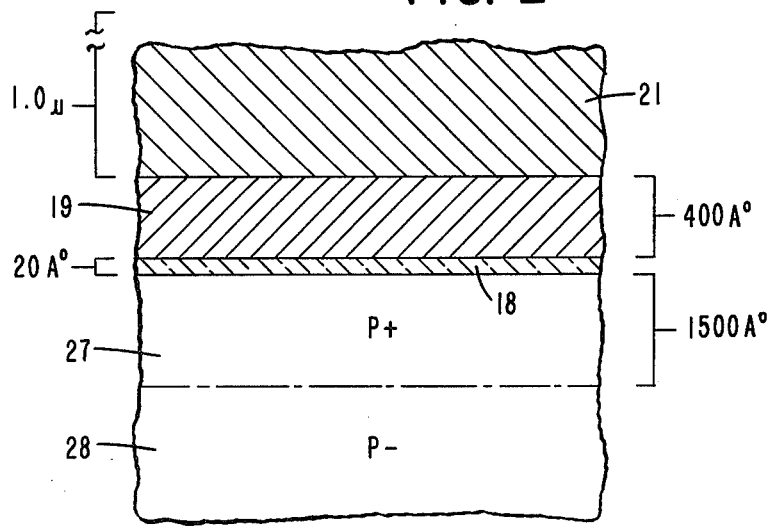
FIG. 2 is an enlarged cross-sectional view of the memory area of the device of FIG. 1.

The resulting cross-section of the memory portion of transistor 10 is shown schematically in FIG. 2. The gate structure comprises a thin silicon dioxide dielectric layer 18 which is 20 A° thick; a silicon nitride dielectric layer 19 which is 400 A° thick; and a 1.0 micron thick aluminum gate electrode 21. The doping profile resulting from the ion implantation into the p-type $10^{15}$/cm$^3$ substrate background doping is an approximately 1500 A° thick p+ layer 27 of approximately $2 \times 10^{18}$/cm$^3$ boron concentration.

The exemplary transistor 10 was subjected to the following sequence of write and erase cycles. Prior to each writing, the device was erased by applying $-20$ volts to the gate with the substrate at 0 volts. Referring to the graph in FIG. 3, the device was written using a +12 volt, 10 millisecond (ms) gate pulse and varying $V_s$ over the range 0 to +5 volts with $V_D$ open and $V_{ss}=0$ volts. ($V_s$, $V_D$, $V_{ss}$ and $V_G$ refer to the source, drain, substrate and gate voltages, respectively). After each write, the threshold voltage VT was measured from $I_{ds}$ versus $V_g$ curves with $V_{ds}=+0.1$ volts.

Figure 3:
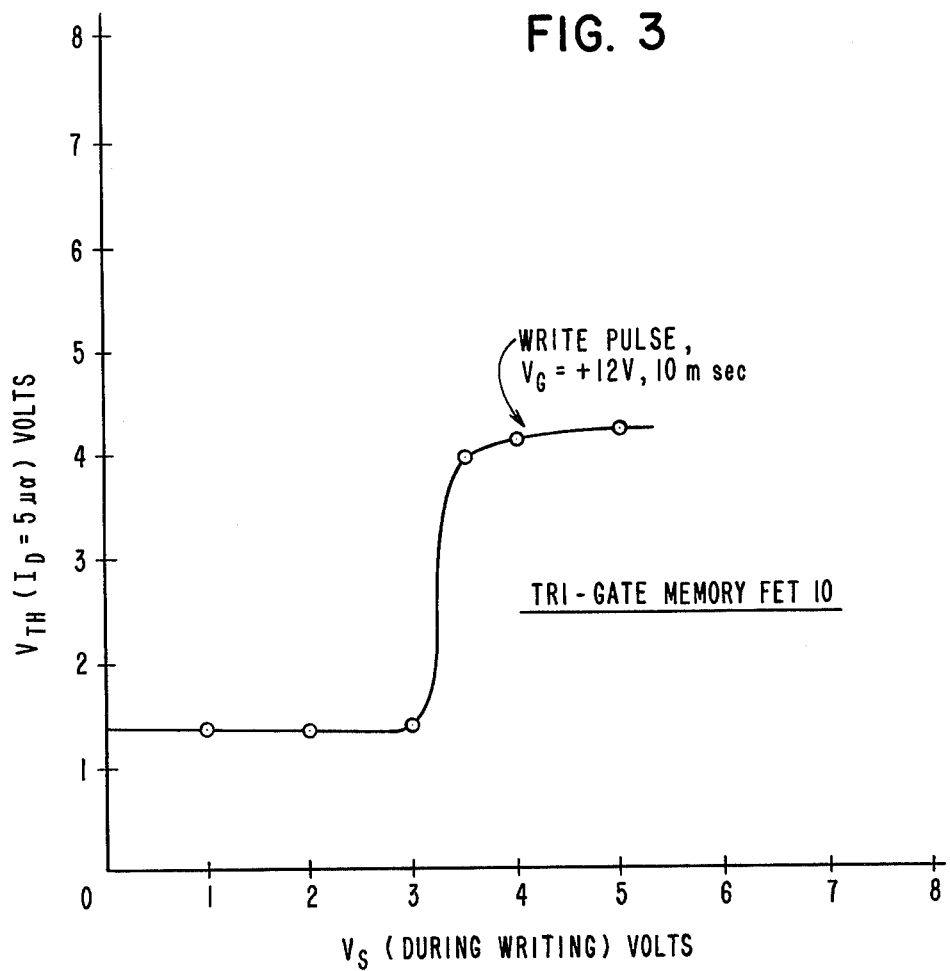

As shown in FIG. 3, writing was initiated for a $V_s$ value of about +3 volts, which agrees well with the predicted silicon avalanche breakdown voltage value of 1 to 4 volts for a p+ doping concentration of the order of $10^{18}$/cm$^3$. The threshold voltage increased from the erased voltage of +1.3 volts for $V_s=0$ volts to a value of about 4.3 volts for $V_s=+5$ volts, giving a "memory threshold window" of about 3 volts between the erased "0" state and the most deeply written "1" state. The data indicate that not only are the control voltage and the write gate voltage requirements low, but that these voltages can be conveniently provided by the industry standard 5 volt and 12 volt power supplies which are used in RAM operation.

It should be noted that the gate voltage is not limited to +12 volts, for voltages either smaller than or larger than +12 V can be used. Those skilled in the art will appreciate that below +12 volts, the decreased potential difference between the gate and the channel decreases writing efficiency. However, it is possible to decrease the gate voltage and achieve adequate transfer of the charge carriers into the gate dielectric for writing.

The state of the memory transistor 10 can be sensed by grounding the source electrode 12 and the substrate 11, applying a positive voltage to the drain 13, and applying a positive voltage to the gate 21. By choosing a gate voltage intermediate the values of the erased and written thresholds, i.e., between VT0 and VT1, the drain current will be an indicator of the binary state of the memory transistor.

EXAMPLE 2

Those skilled in the art will readily appreciate that a split gate embodiment of the low voltage write FET 10, which comprises a memory section 33 and only one of the non-memory sections 31 or 32, is readily formed. The split gate transistor is formed using the aforementioned process for the FET 10 and adjusting the masks used in the memory gate deposition and memory oxide formation steps to form the memory section 33 at one end of the channel adjacent the source or drain and to form an adjacent, non-memory section at the opposite end of the channel adjacent the drain or source. For example, to form a drain-protected split gate structure with memory region 33 adjacent the source and non-memory region 32 adjacent the drain, the aforementioned process is modified, in pertinent part, by using a memory gate implantation mask which exposes the desired memory region adjacent the source and protects the non-memory region adjacent the drain. The memory gate implant thus forms p+ region 27 adjacent the source under memory region 33. Then, the previously-formed thick (about 400 Angstroms) non-memory silicon dioxide gate layer is etched away in the translated memory region 33 (using the gate implantation mask) and the thin memory oxide is grown in the memory region 33.

EXAMPLE 3

Figure 4:
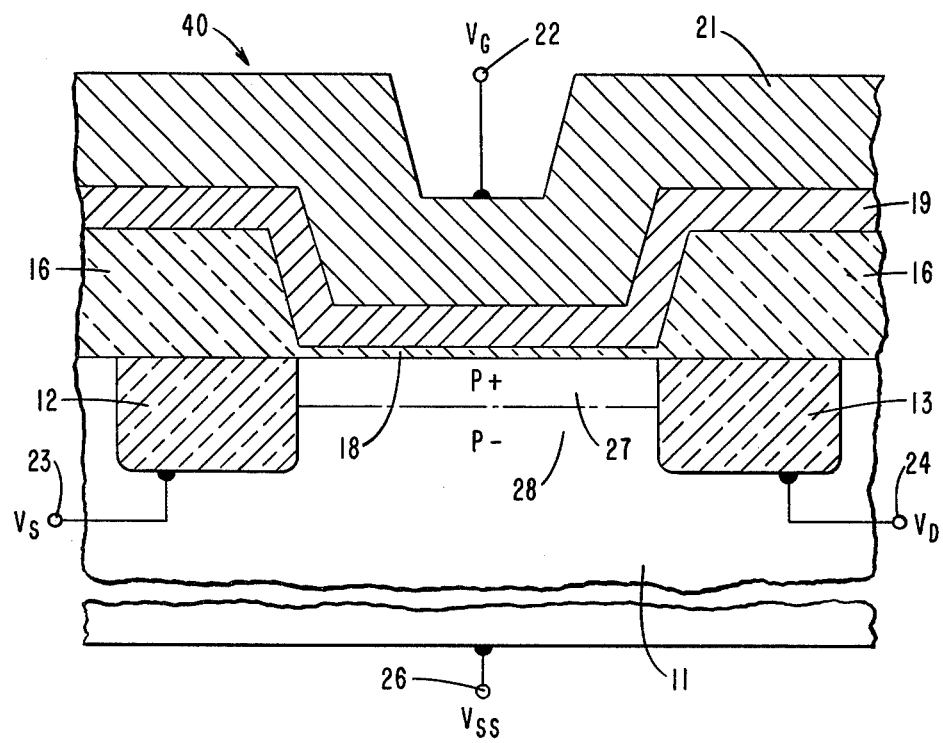

FIG. 4 shows an embodiment of the invention in the form of a pure memory device, that is, a FET 40 in which the memory oxide spans the channel length, i.e. neither of the non-memory oxide sections 31 and 32 is present. To adjust the process described for forming trigate FET 10 to form FET 40, the thick 400 A° (non-memory) gate oxide is formed over the channel region; a memory gate implant mask is used which exposes the entire channel length to the implant so that the resulting p+ region 27 spans the channel length; the non-memory oxide is then removed along the length of the channel; and the memory oxide is grown spanning the length of the channel.

FIG. 5 presents the low voltage write characteristics of a pure memory device 40 which was formed using the same parameters as the exemplary FET 10, with the above-listed adjustments in the memory gate masks. As shown, writing was initiated for a $V_S$ value of about $+2$ to $+3$ volts, which again is within the predicted range of silicon avalanche breakdown voltage values of $+1$ to $+4$ volts for a p+ doping concentration of the order of $10^{18}/cm^3$. The threshold voltage increased from the erased voltage of about $-1.4$ volts for $V_S=0$ volts to a value of about $+2.5$ volts for $V_S=+5$ volts, giving a memory threshold window of about 4 volts between the erased "0" state and the most deeply written "1" state. Again, the data indicated that not only are the control voltage and the write gate voltage requirements low, but that these voltages can be conveniently provided by the industry standard 5 volt and 12 volt power supplies used in RAM operation.

Thus, there has been described split gate, trigate, and pure memory MNOS alterable threshold memory transistors which can be written with low voltage. Each exemplary device is n-channel and depends for its operation upon the presence of a p+ type surface layer in the memory channel region. The doping is conveniently done by ion implantation of boron or other suitable p type impurity. Writing with 0 volts on the source results in little change of threshold voltage from that of the erased state. However, if it is desired to write the device, the source (or drain) is set above approximately $+1$ to $+4$ volts. Conveniently, the source can be set to the 5 volt level used in RAM power supplies. This induces avalanche breakdown of the silicon substrate in the depleted portion of the p+ layer in the memory channel. Hot electron carriers are generated which are injected into the memory gate insulator. The negative charge is trapped in the insulator and the threshold voltage is shifted to a more positive write state value. Of course, those skilled in the art will appreciate that the principles taught herein are applicable to other charge storage technologies such as SNOS (silicon-nitride-oxide-semiconductor) and SONOS (silicon-oxide-nitride-oxide-semiconductor), are applicable to p-channel structures by using n+n− layers, and that the dimensions and concentrations of the crucial p+p− and n+n− layers can be varied to tailor the operational characteristics of the device to a particular application.

What is claimed is:

1. An avalanche-written semiconductor memory device comprising:
   a semiconductive substrate of a first conductivity type;
   a charge storage gate structure formed on said substrate and having at least a memory portion;
   a first relatively thin surface-adjacent substrate region having a first, relatively high concentration of at least about $10^{18}$ per cubic centimeter of impurities of the first conductivity type and having a predetermined thickness, said first region extending along the length of the memory portion of the gate structure;
   a second substrate region beneath said first region and having a second, relatively low concentration of impurities of the first conductivity type;
   said gate structure further including a gate electrode for applying a write voltage across the first surface-adjacent substrate region to thereby form in said first substrate region an inverted region and an underlying depletion region of a thickness substantially less than said first substrate region thickness; and
   an impurity region of a second conductivity type formed in said substrate for applying a control voltage between said inverted region and said second substrate region causing avalanche breakdown of said depletion region and thereby providing charges to write said device by transfer of said charges to said gate structure.

2. The semiconductor memory device of claim 1 wherein the substrate and the substrate regions are p type or n type and the first and the second substrate regions are p+ and p− or n+ and n−, respectively.

3. The semiconductor memory device of claim 1 wherein the first relatively thin surface-adjacent substrate region is approximately 1500 Angstroms thick.

4. The semiconductor memory device of claim 3 wherein said write voltage is in the range (5–12) volts and said control voltage is less than or equal to 5 volts.

5. The semiconductor memory device of claim 1 wherein said impurity region is either a source or drain.

6. A low voltage avalanche write semiconductor memory device comprising:
   a conductive p-type substrate having a concentration of $10^{15}$ per cubic centimeter and having spaced-apart n-type source and drain therein;
   a charge storage gate structure overlying the substrate between said source and said drain and comprising a layer of silicon dioxide including a memory oxide portion within the range approximately 10–60 Angstroms thick formed on the substrate over at least a section of the substrate between said source and said drain and a layer of silicon nitride about 400 Angstroms thick formed over the layer of silicon dioxide;
   a surface-adjacent substrate region approximately 1500 Angstroms thick extending beneath the memory oxide portion and having a p-type impurity concentration of approximately $2 \times 10^{18}$ per cubic centimeter;
   said gate structure further including a conductive gate electrode formed over the silicon nitride for applying a write voltage across said surface-adjacent substrate region to thereby form a channel inversion in said surface-adjacent substrate region and an underlying depletion region in said surface-adjacent region, said depletion region being of a thickness substantially less than 1500 Angstroms; and
   at least one of said source and said drain being suitable for applying a control voltage between said surface-adjacent substrate region and the underlying substrate and thereby across the depletion region, causing avalanche breakdown of said depletion region and thereby providing charges to write said device by transfer of said charges to said gate structure.

7. The semiconductor memory device of claim 6, including a relatively thick non-memory oxide portion over the channel region and adjacent at least one of the source and the drain.

8. The semiconductor memory device of claim 6, wherein the memory oxide portion spans the length of the channel.

9. The memory device of claim 7 or 8 wherein the gate structure includes a gate electrode of one of aluminum, aluminum alloy, or polysilicon.

* * * * *